United States Patent
Kurooka

(10) Patent No.: US 6,310,568 B1
(45) Date of Patent: Oct. 30, 2001

(54) DIGITAL-TO-ANALOG CONVERSION CIRCUIT

(75) Inventor: Kazuaki Kurooka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/549,239

(22) Filed: Apr. 13, 2000

(30) Foreign Application Priority Data

Nov. 24, 1999 (JP) .................................................. 11-333438

(51) Int. Cl.$^7$ ........................................................ H03M 1/66
(52) U.S. Cl. ............................................. 341/144; 341/138
(58) Field of Search ................................... 341/144, 138, 341/154, 140, 147, 153

(56) References Cited

U.S. PATENT DOCUMENTS 5,168,245   12/1992   Koskowich .
5,757,298 * 5/1998 Manley ................................ 341/138
5,841,384 * 11/1998 Herman ................................ 341/138

FOREIGN PATENT DOCUMENTS 55-34536    3/1980   (JP) .
61-295721   12/1986  (JP) .
7-202688    8/1995   (JP) .
7-264062    10/1995  (JP) .
9-261012    10/1997  (JP) .

* cited by examiner

Primary Examiner—Brian Young
(74) Attorney, Agent, or Firm—Leydig, Voit & Mayer, Ltd.

(57) ABSTRACT

A digital-to-analog conversion circuit includes first and second MOS transistors. The first MOS transistors have different sizes corresponding to bits in received digital data, and apply a weight to an input current by switching and outputting a weighted current. The second MOS transistors also have different sizes corresponding to the bits in the digital data, and apply a weight to a current input to the first MOS transistors that are turned ON by switching. The second MOS transistors apply the weight so that the sum of the currents output from the first MOS transistors has a non-linear characteristic.

8 Claims, 7 Drawing Sheets

| REGISTER 3 | 2 | 1 | 0 | DAC OUTPUT CURRENT VALUES | |
|---|---|---|---|---|---|
| 0 | 0 | 0 | 0 | {100/(10+15)}×0= | 0.0 μA |
| 0 | 0 | 0 | 1 | {100/(10+14)}×1= | 4.17 μA |
| 0 | 0 | 1 | 0 | {100/(10+13)}×2= | 8.70 μA |
| 0 | 0 | 1 | 1 | {100/(10+12)}×3= | 13.64 μA |
| 0 | 1 | 0 | 0 | {100/(10+11)}×4= | 19.05 μA |
| 0 | 1 | 0 | 1 | {100/(10+10)}×5= | 25.00 μA |
| 0 | 1 | 1 | 0 | {100/(10+9)}×6= | 31.58 μA |
| 0 | 1 | 1 | 1 | {100/(10+8)}×7= | 38.89 μA |
| 1 | 0 | 0 | 0 | {100/(10+7)}×8= | 47.06 μA |
| 1 | 0 | 0 | 1 | {100/(10+6)}×9= | 56.25 μA |
| 1 | 0 | 1 | 0 | {100/(10+5)}×10= | 66.67 μA |
| 1 | 0 | 1 | 1 | {100/(10+4)}×11= | 78.58 μA |
| 1 | 1 | 0 | 0 | {100/(10+3)}×12= | 92.31 μA |
| 1 | 1 | 0 | 1 | {100/(10+2)}×13= | 108.33 μA |
| 1 | 1 | 1 | 0 | {100/(10+1)}×14= | 127.27 μA |
| 1 | 1 | 1 | 1 | {100/(10+0)}×15= | 150.00 μA |

| REGISTER 3 | 2 | 1 | 0 | DAC OUTPUT CURRENT VALUES | |
|---|---|---|---|---|---|
| 0 | 0 | 0 | 0 | (100/10)×0= | 0.0 μA |
| 0 | 0 | 0 | 1 | (100/10)×1= | 10.0 μA |
| 0 | 0 | 1 | 0 | (100/10)×2= | 20.0 μA |
| 0 | 0 | 1 | 1 | (100/10)×3= | 30.0 μA |
| 0 | 1 | 0 | 0 | (100/10)×4= | 40.0 μA |
| 0 | 1 | 0 | 1 | (100/10)×5= | 50.0 μA |
| 0 | 1 | 1 | 0 | (100/10)×6= | 60.0 μA |
| 0 | 1 | 1 | 1 | (100/10)×7= | 70.0 μA |
| 1 | 0 | 0 | 0 | (100/10)×8= | 80.0 μA |
| 1 | 0 | 0 | 1 | (100/10)×9= | 90.0 μA |
| 1 | 0 | 1 | 0 | (100/10)×10= | 100.0 μA |
| 1 | 0 | 1 | 1 | (100/10)×11= | 110.0 μA |
| 1 | 1 | 0 | 0 | (100/10)×12= | 120.0 μA |
| 1 | 1 | 0 | 1 | (100/10)×13= | 130.0 μA |
| 1 | 1 | 1 | 0 | (100/10)×14= | 140.0 μA |
| 1 | 1 | 1 | 1 | (100/10)×15= | 150.0 μA |

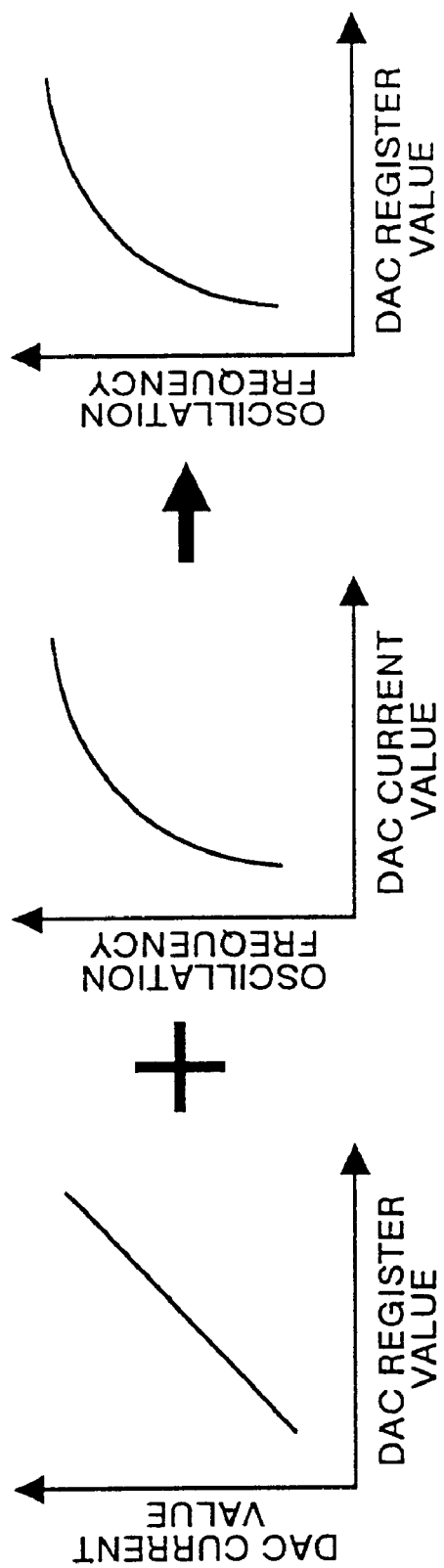

DIGITAL-TO-ANALOG CONVERSION CIRCUIT

FIELD OF THE INVENTION

The present invention relates to a digital-to-analog conversion circuit which generates a current to be input into an ICO (current-controlled oscillator) or the like. More particularly, this invention relates to a digital-to-analog conversion circuit which outputs a current that is non-linear relative to an input digital value.

BACKGROUND OF THE INVENTION

In a PLL (Phase-Locked Loop) circuit utilized in a circuit for reading a magnetic disk or a circuit for receiving a data transmission or the like, an ICO (current-controlled oscillator) is used in many cases for taking out an output signal synchronous with a desired signal. Usually, a digital signal is output from a phase comparator that is a constituent element of the PLL circuit. Therefore, when the ICO is used, it is particularly necessary to provide a digital-to-analog conversion circuit which converts the digital signal output from the phase comparator into an analog control current.

FIG. 5 shows a circuit structure of a conventional digital-to-analog conversion circuit used in the PLL circuit and others. To facilitate the explanation, the digital-to-analog conversion circuit shown in FIG. 5 has a circuit structure for inputting four-bit digital data. Usually, digital data output from the phase comparator is first stored in registers constituting a buffer, and the ICO converts the data stored in the registers into a current value. Referring to FIG. 5, registers 0 to 3 represent bits of four-bit data stored in these registers. The register 3 has a highest-order bit and the register 0 has a lowest-order bit.

The digital-to-analog conversion circuit shown in FIG. 5 includes inverters G0 to G3 which invert the inputs of the registers 0 to 3 respectively. This digital-to-analog conversion circuit also includes twelve MOS transistors and four inverters for taking out a current from a power source voltage Vdd according to signals output from the inverters G0 to G3 and for outputting the current taken out as a DAC current (a digital-to-analog current). Particularly, a structure having three MOS transistors and one inverter is allocated to each bit stored in each register.

As shown in FIG. 5, a p-channel MOS transistor M12 with its source connected to the power source voltage Vdd and a p-channel MOS transistor M13 with its drain connected to a constant current source 9 are connected in series to the register 0. A p-channel MOS transistor M11 with its source connected to the power source voltage Vdd and with its drain connected to an output terminal of a DAC current has its gate connected to a connection point between the p-channel MOS transistors M12 and M13, that is, the drain of the p-channel MOS transistor M12 and the source of the p-channel MOS transistor M13.

Then, an output of an inverter G10 for further inverting the output. of the inverter G0 is input into the gate of the p-channel MOS transistor M12. The output of the inverter G0 is input into the gate of the p-channel MOS transistor M13. In this case, a channel width (hereinafter to be referred to as a W-size) of the p-channel MOS transistor M11 is set to a.

Based on this structure, when the register 0 has a logic level "L", the output of the inverter G0 will have a logic level "H". This logic level "H" is input into the gate of the p-channel MOS transistor M13, to turn OFF the p-channel MOS transistor M13. Further, as the output of the inverter G0 is input into the inverter G10, the output of the inverter G10 will have a logic level "L". This logic level "L" is input into the gate of the p-channel MOS transistor M12, to turn ON the p-channel MOS transistor M12. Thus, the potential of the gate of the p-channel MOS transistor M11 increases, and the p-channel MOS transistor M11 is turned OFF. Therefore, the electric current is not supplied by the drain of the p-channel MOS transistor M11, and accordingly the DAC current does not increase.

On the other hand, when the register 0 has the logic level "H", the output of the inverter G0 will have a logic level "L". This logic level "L" is input into the gate of the p-channel MOS transistor M13, to turn ON the p-channel MOS transistor M13. Further, the output of the inverter G10 has the logic level "H", and this logic level "H" turn OFF the p-channel MOS transistor M12. Thus, the potential of the gate of the p-channel MOS transistor M11 is lowered by the lead-in current of the constant current source 9, and the p-channel MOS transistor M11 is turned ON. In other words, a current taken out from the power source voltage Vdd appears in the drain of the p-channel MOS transistor M11, and this current is added to the DAC current.

Similarly, a p-channel MOS transistor M22 having its source connected to the power source voltage Vdd and a p-channel MOS transistor M23 having its drain connected to a constant current source 9 are connected in series to the register 1. A p-channel MOS transistor M21 with its source connected to the power source voltage Vdd and with its drain connected to an output terminal of a DAC current has its gate connected to a node between the p-channel MOS transistors M22 and M23, that is, the drain of the p-channel MOS transistor M22 and the source of the p-channel MOS transistor M23.

Output of an inverter G20 which inverts the output of the inverter G1 is input into the gate of the p-channel MOS transistor M22. The output of the inverter G1 is input into the gate of the p-channel MOS transistor M23. The W-size of the p-channel MOS transistor M21 is set to two times the W-size of the p-channel MOS transistor M11, that is a×2. Since the drain current of the MOS transistor is directly proportional to the W-size, the drain current of the p-channel MOS transistor M21, that is the current that can be added to the DAC current, becomes two times the drain current of the p-channel MOS transistor M11.

With such a constitution, when the register 1 has the logic level "L", the output of the inverter G1 will have a logic level "H". This logic level "H" turns OFF the p-channel MOS transistor M23. As the output of the inverter G1 is input into the inverter G20, the output of the inverter G20 will have a logic level "L". This logic level "L" turns ON the p-channel MOS transistor M22. Thus, the gate potential of the p-channel MOS transistor M21 is increased, and the p-channel MOS transistor M21 is turned OFF. Therefore, the electric current is not supplied by the drain of the p-channel MOS transistor M21, and accordingly the DAC current does not increase.

On the other hand, when the register 0 has the logic level "H", the output of the inverter G1 will have a logic level "L". This logic level "L" turns ON the p-channel MOS transistor M23. Further, the output of the inverter G20 has the logic level "H", and this logic level "H" turns OFF the p-channel MOS transistor M22. Thus, the potential of the gate of the p-channel MOS transistor M21 is lowered by the lead-in current of the constant current source S, and the p-channel MOS transistor M21 is turned ON. In other words, a current taken out from the power source voltage Vdd appears in the drain of the p-channel MOS transistor M21, and this current is added to the DAC current.

The register 2 and the register 3 also have structures and operations similar to those described above, and their explanation will be omitted. However, in FIG. 5, of the structure corresponding to the register 2, the W-size of a p-channel MOS transistor M31 is four times the W-size of the p-channel MOS transistor M11, that is a×4. Further, of the structure corresponding to the register 3, the W-size of a p-channel MOS transistor M41 is eight times the W-size of the p-channel MOS transistor M11, that is a×8. Accordingly, the drain currents of the p-channel MOS transistors M31 and M41 also are four times and eight times of the drain current of the p-channel MOS transistor M11 respectively.

As explained above, there is provided for each of the registers 0 to 3 a structure for adding a current to the DAC current according to the signal level of each register. Further, the W-sizes is changed among the MOS transistors M11, M21, M31 and M41 that supply a current respectively. With this arrangement, it is possible to output the DAC current as a sum of signals of these registers, that is, as a sum of currents of these registers with different weight on each bit. In the drawing, a p-channel MOS transistor M0 functions as a load element. In this case, the W-size of this transistor M0 is ten times the W-size of the p-channel MOS transistor M11, that is, a×10.

FIG. 6A and FIG. 6B are diagrams which show an example of DAC current values that are output based on the values of the resisters 0 to 3 in the prior-art digital-to-analog conversion circuit (current value of the constant current source 9 is 100 μA). For example, as shown in FIG. 6A, when the register 3, the register 2, the register 1 and the register 0 have the logic levels "H", "H", "L" and "H" respectively, that is, when the four-bit data is "1101", a DAC current of 130 μA is output as a result of the sum of the drain currents of the p-channel MOS transistors M41, M31 and M11, that is, the sum of 80 μA, 40 μA and 10 μA.

In other words, as a decimal value expressed by the four bits of the registers 0 to 3 increases from 0 to 15, the DAC current value increases linearly as shown in FIG. 6B. Accordingly, in the PLL circuit, each time when a digital value output from the phase comparator increases by one, a DAC current that increases linearly is input into the ICO.

In general, the above-described ICO is for increasing the oscillation frequency of the signal that is output based on the increase in the input current value. However, as the oscillation frequency to be obtained becomes higher, the increase in the oscillation frequency obtained for each increase in the current value becomes smaller. Thus, the characteristics of the oscillation frequency become non-linear as the oscillation frequency to be obtained becomes higher.

In the above-described conventional digital-to-analog conversion circuit, the DAC current value increases linearly along with an increase in the input digital value (DAC register value). However, when this DAC current value is input into the ICO, the angle of the slope of increase in the oscillation frequency of the signal output from the ICO becomes smaller as the digital value output from the phase comparator attains a larger value. Therefore, there is a problem that a high-speed synchronization can not be carried out when signals of a large phase difference are input into the PLL circuit.

FIG. 7 is a diagram which shows the above-described relationship between the DAC register values and the oscillation frequency in the PLL circuit. As shown in FIG. 7, when a linear relationship between the DAC register values and the DAC current values in the conventional digital-to-analog conversion circuit is added to a non-linear relationship between the DAC current values and the oscillation frequency in the ICO, there is obtained a non-linear relationship between the DAC register values and the oscillation frequency.

SUMMARY OF THE INVENTION

It is an object of the present invention to provide a digital-to-analog conversion circuit having a non-linear input and output characteristic which makes the oscillation frequency increase linearly in the ICO or like along with an increase in the digital value generated in the PLL circuit or the like.

According to one aspect of the invention, currents that are output according to input digital values (corresponding to DAC currents described later) are added together by the switching operation of first MOS transistors allocated to respective bits. The distribution of current values corresponding to the digital values is controlled by second MOS transistors to have a non-linear relationship. Therefore, when the DAC currents are input into other circuit that produces a non-linear physical output for a current input, it is possible to obtain an output of physical quantity that linearly changes for inputs of digital values in this circuit.

Further, the above-described non-linear input and output characteristic are obtained, by changing the sizes of the first MOS transistors and the second MOS transistors becoming ON, depending upon the statuses of each bits of the digital values input.

Further, the second MOS transistors can control the first MOS transistors so that the non-linear relationship of the current values output to the input digital values can be expressed by a graph having a convex shape facing downward. Thus, when the DAC currents are input into other circuit that produces a non-linear physical output for a current input that is expressed by a graph having a convex shape facing upward. Therefore, it is possible to obtain an output of physical quantity that changes linearly based on inputs of digital values in this circuit.

Further, for each bit constituting the digital values, there is allocated a structure consisting of the first MOS transistor and a third MOS transistor which are set to ON statuses when the corresponding bits are in ON statuses, and there is allocated a structure consisting of the second MOS transistor and a fourth MOS transistor which are set to OFF statuses when the corresponding bits are in ON statuses. Furthermore, the second to fourth MOS transistors are connected to the constant current source. Therefore, it is possible to output the DAC currents obtained from the first MOS transistors by weighting each of the above-described structures based on the currents of the constant current source.

Further, for each bit constituting the digital values, there is allocated a structure consisting of the first MOS transistor and eL third MOS transistor connected in series with the first MOS transistor and having its gate connected to the constant current source which are set to ON statuses when the corresponding bits are in ON statuses, and there is also allocated a structure consisting of the second MOS transistor and a fourth MOS transistor having its gate connected to the constant current source which are set to OFF statuses when the corresponding bits are in ON statuses. Therefore, it is possible to output the DAC currents obtained from the first MOS transistors by weighting each of the above-described structures based on the currents of the constant current source.

5

Other objects and features of this invention will become apparent from the following description with reference to the accompanying drawings.

BRIEF DESCRIPTION OF THE DRAWINGS

FIG. 5 is a diagram which shows a circuit structure of a conventional digital-to-analog conversion circuit used in a PLL circuit and the like;

FIG. 7 is a diagram which shows a relationship between DAC register values and an oscillation frequency in a PLL circuit of the conventional digital-to-analog conversion circuit.

DESCRIPTION OF THE PREFERRED EMBODIMENTS

Figure 1:
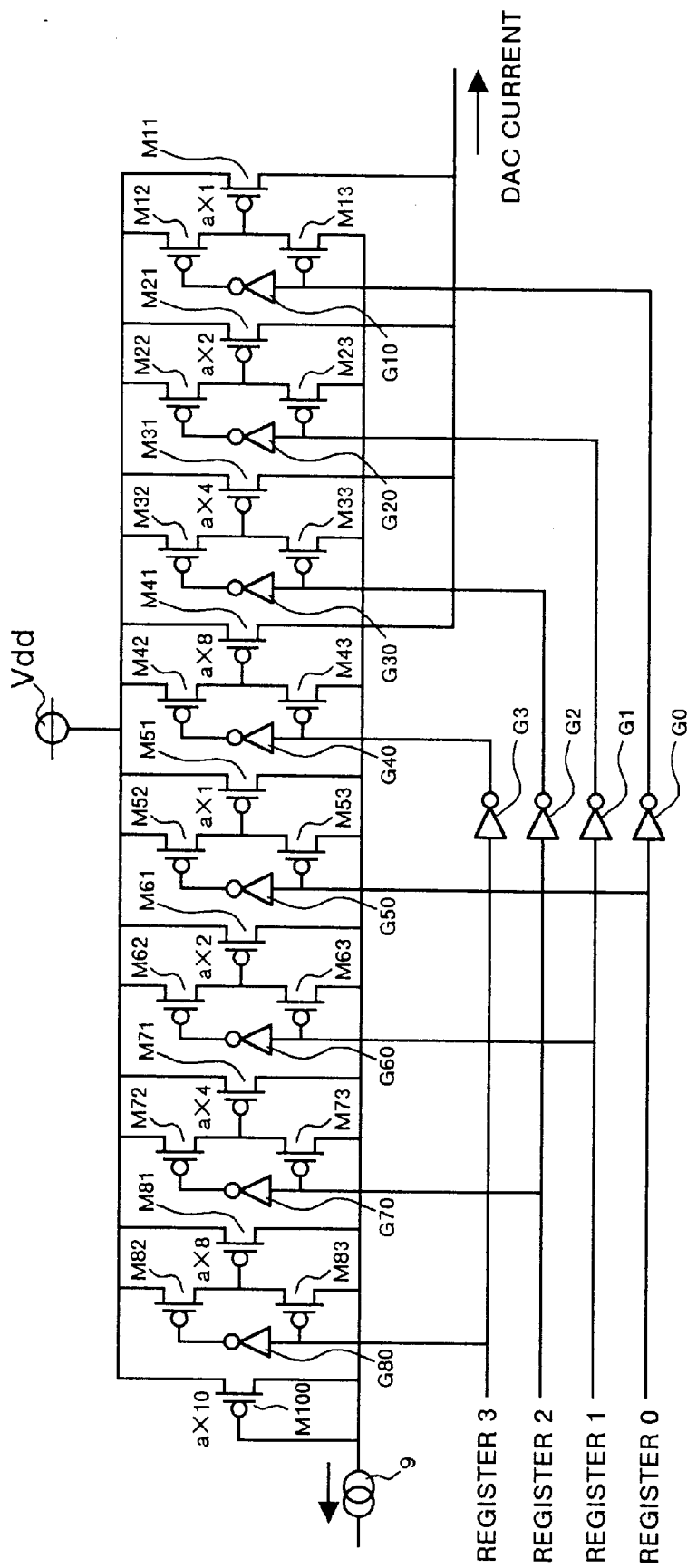
FIG. 1 is a diagram which shows a circuit structure of a digital-to-analog conversion circuit of a first embodiment.

Embodiments of a digital-to-analog conversion circuit according to the present invention are described below referring to the drawings.

The digital-to-analog conversion circuit relating to a first embodiment has a non-linear input/output characteristic such that it outputs a DAC current having a higher rate of increase as the value in the registers 0 to 3 increases.

Figure 5:
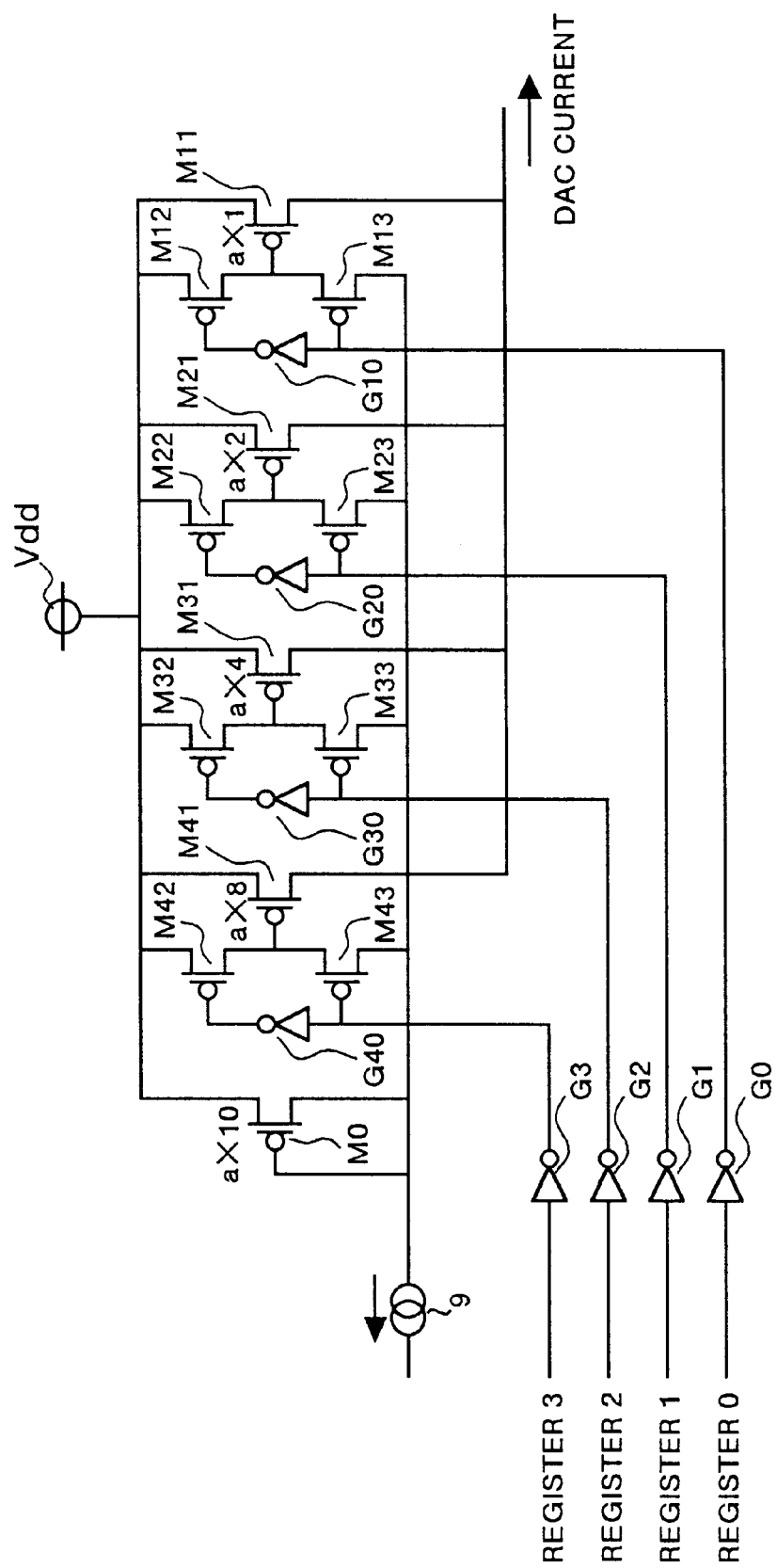
Figures 6A, 6B:
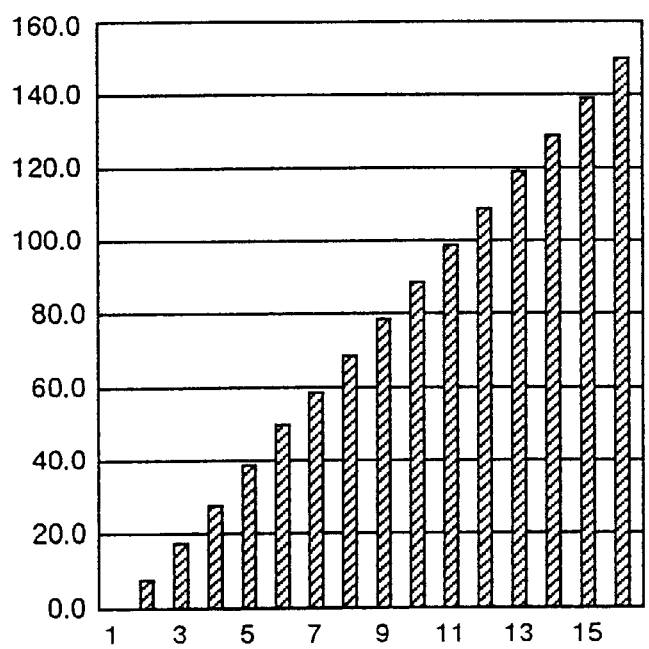
FIG. 6A and FIG. 6B are diagrams which show an example of DAC current values output for values of registers 0 to 3 in the conventional digital-to-analog conversion circuit.

FIG. 1 is a diagram which shows a circuit structure of the digital-to-analog conversion circuit of the first embodiment. In FIG. 1, portions common to those in FIG. 5 are given the same reference numbers and their explanation will be omitted. Particularly, in order to facilitate the explanation, the circuit structure of the digital-to-analog conversion circuit shown in FIG. 1 shows a case of inputting four-bit digital data as is the case with FIG. 5.

According to the digital-to-analog conversion circuit shown in FIG. 1, in addition to the structure of the conventional digital-to-analog conversion circuit shown in FIG. 5, there are provided twelve p-channel MOS transistors M51, M52, M53, M61, M62, M63, M71, M72, M73, M81, M82 and M83 and four inverters G50, G60, G70 and G80 for controlling the control currents to drive the p-channel MOS transistors M11, M21, M31 and M41, that is, for controlling the drain currents of the p-channel MOS transistors M13, M23, M33 and M43 based on the values in the registers 0 to 3. In FIG. 1, a p-channel MOS transistor M100 corresponds to the p-channel MOS transistor MO shown in FIG. 5. The W-size of the p-channel MOS transistor M100 is ten times the W-size of the p-channel MOS transistor M11, that is, a×10.

The structure and the operation of the digital-to-analog conversion circuit shown in FIG. 1 will be explained taking into consideration the constitution that is different from the prior-art digital-to-analog conversion circuit. In FIG. 1, the p-channel MOS transistor M52 having its source connected to the power source voltage Vdd and the p-channel MOS transistor M53 having its drain connected to the constant current source 9 are connected in series to the register 0. The p-channel MOS transistor M51 with its source connected to the power source Vdd and with its drain connected to the constant current source 9 has its gate connected to a connection point between the p-channel MOS transistors M52 and M53, that is, the drain of the p-channel MOS transistor M52 and the source of the p-channel MOS transistor M53.

Output of the inverter G50, which further inverts the signal of the register 0 is input into the gate of the p-channel MOS transistor M52. The signal in the register 0, is input into the gate of the p-channel MOS transistor M53. In this case, the W-size of the p-channel MOS transistor M51 is the same as the W-size of the p-channel MOS transistor M11, that is a.

With such a constitution, when the register 0 has the logic level "L", the p-channel MOS transistor M13 is turned OFF and the p-channel MOS transistor M53 is turned ON, based on the output of the inverter G0. As the output of the inverter G0 is input into the inverter G10, the logic level "L" that is the output of the inverter G10 places the p-channel MOS transistor M12 in an ON status. Further, as the signal of the register 0 is also input into the inverter G50, the logic level "H" that is the output of the inverter G50 places the p-channel MOS transistor M52 in an OFF status. Accordingly, the p-channel MOS transistor M51 becomes an ON status as well as the ON status of the p-channel MOS transistor M53. Therefore, the potential of the gate of the p-channel MOS transistor M11 increases, and the p-channel MOS transistor M11 is set to an OFF status, so that the electric current is not supplied by the drain of the p-channel MOS transistor M11, and the DAC current does not increase.

On the other hand, when the register 0 has the logic level "H", the p-channel MOS transistor M13 is turned ON and the p-channel MOS transistor M53 is turned OFF, based on the output of the inverter G0. Further, the logic level "H" that is the output of the inverter G10 places the p-channel MOS transistor M12 in an OFF status. Furthermore, as the signal of the register 0 is also input into the inverter G50, the logic level "L" that is the output of the inverter G50 places the p-channel MOS transistor M52 in an ON status. The p-channel MOS transistor M51 becomes an OFF status as well as the OFF status of the p-channel MOS transistor M53.

Thus, the potential of the gate of the p-channel MOS transistor M11 is lowered by the lead-in current of the constant current source 9, and the p-channel MOS transistor M11 is set to an ON status. In other words, a current taken out from the power source voltage Vdd appears in the drain of the p-channel MOS transistor M11, and this current is added to the DAC current.

Similarly, the p-channel MOS transistor M62 having its source connected to the power source voltage Vdd and the p-channel MOS transistor M63 having its drain connected to the constant current source 9 are connected in series to the register 1. The p-channel MOS transistor M61 with its source connected to the power source voltage Vdd and with its drain connected to the constant current source 9 has its gate connected to a connection point between the p-channel MOS transistors M62 and M63, that is, the drain of the p-channel MOS transistor M62 and the source of the p-channel MOS transistor M63.

Then, an output of the inverter G60, which further inverts the signal of the register 1, is input into the gate of the p-channel MOS transistor M62. The signal of the register 1 is input into the gate of the p-channel MOS transistor M63. In this case, the W-size of the p-channel MOS transistor M61 is set to two times the W-size of the p-channel MOS transistor M11, that is a×2. As the drain current of the MOS transistor is proportional to the W-size, the drain current of the p-channel MOS transistor M51 becomes two times the drain current of the p-channel MOS transistor M51.

With the above-described structure, when the register 1 has the logic level "L", the p-channel MOS transistor M23 is turned OFF and the p-channel MOS transistor M63 is turned ON, based on the output of the inverter G1. As the output of the inverter G1 is also input into the inverter G20, the logic level "L" that is the output of the inverter G20 places the p-channel MOS transistor M22 in an ON status. Further, as the signal of the register 1 is also input into the inverter G60, the logic level "H" that is the output of the inverter G60 places the p-channel MOS transistor M62 in an OFF status. Accordingly, the p-channel MOS transistor M61 becomes an ON status as well as the ON status of the p-channel MOS transistor M63.

As a result, the potential of the gate of the p-channel MOS transistor M21 increases, and the p-channel MOS transistor M21 is set to an OFF status, so that the electric current is not supplied by the drain of the p-channel MOS transistor M21, and the DAC current does not increase.

On the other hand, when the register 1 has the logic level "H", the p-channel MOS transistor M23 is turned ON and the p-channel MOS transistor M63 is turned OFF, based on the output of the inverter G1. Further, the logic level "H" that is the output of the inverter G20 places the p-channel MOS transistor M22 in an OFF status. Further, as the signal of the register 1 is also input into the inverter G60, the logic level "L" that is the output of the inverter G60 places the p-channel MOS transistor M62 in an ON status. The p-channel MOS transistor M61 becomes an OFF status as well as the OFF status of the p-channel MOS transistor M63.

Thus, the potential of the gate of the p-channel MOS transistor M21 is lowered by the lead-in current of the constant current source 9, and the p-channel MOS transistor M21 is set to an ON status. In other words, a current taken out from the power source voltage Vdd appears in the drain of the p-channel MOS transistor M21, and this current is added to the DAC current.

The register 2 and the register 3 also have structures and operations similar to those described above, and their explanation will be omitted. However, in FIG. 1, of the structure corresponding to the register 2, the W-size of the p-channel MOS transistor M71 has four times the W-size of the p-channel MOS transistor M11, that is a×4. Further, of the structure corresponding to the register 3, the W-size of the p-channel MOS transistor M81 has eight times the W-size of the p-channel MOS transistor M11, that is a×8. Accordingly, the drain currents cf the p-channel MOS transistors M71 and M81 also have four times and eight times of the drain current of the p-channel MOS transistor M11 respectively.

As explained above, there is provided for each of the registers 0 to 3 a structure for adding a current to the DAC current according to the signal level of each register. Further, the W-sizes between the MOS transistors M11, M21, M31 and M41 that supply a current respectively are changed. With this arrangement, it is possible to output the DAC current as a sum of signals of these registers, that is, as a sum of currents of these registers with different weight on each bit.

In this case, the DAC currents that appear based on the respective ON statuses of the p-channel MOS transistors M11, M21, M31 and M41 are determined when the p-channel MOS transistors M13, M23, M33 and M43 are in the ON statuses respectively. In the circuit structure shown in FIG. 1, the values of the drain currents of these p-channel MOS transistors M13, M23, M33 and M43 are determined based on the ON/OFF statuses of the p-channel MOS transistors M51, M61, M71 and M81 respectively. As the ON/OFF statuses of the p-channel MOS transistors M51, M61, M71 and M81 are controlled according to the signals of the registers 0 to 3 as described above, it remains unchanged that the DAC currents change according to the signals of the registers 0 to 3.

However, according to the digital-to-analog conversion circuit of the first embodiment, the ON/OFF control of the p-channel MOS transistors M11, M21, M31 and M41 and the ON/OFF control of the p-channel MOS transistors M51, M61, M71 and M81 are mutually inverted with respect to the logic status of the four bits in the registers 0 to 3. Accordingly, the DAC current value becomes smaller than that of the conventional digital-to-analog conversion circuit, by the current component corresponding to the drain current of the p-channel MOS transistor M51, M61, M71 or M81 that becomes the ON status for the signals of 1the registers 0 to 3 excluding a maximum value (15) and a minimum value (0).

Particularly, as the value expressed by the registers 0 to 3 increases, the p-channel MOS transistor M51, M61, M71 or M81 that becomes an ON status is selected so that the rate of increase in the sum of the drain currents becomes lower. Therefore, the distribution of DAC currents for the values in the registers 0 to 3 (DAC register values) is expressed to have a non-linear relationship as described later.

Figures 2A, 2B:
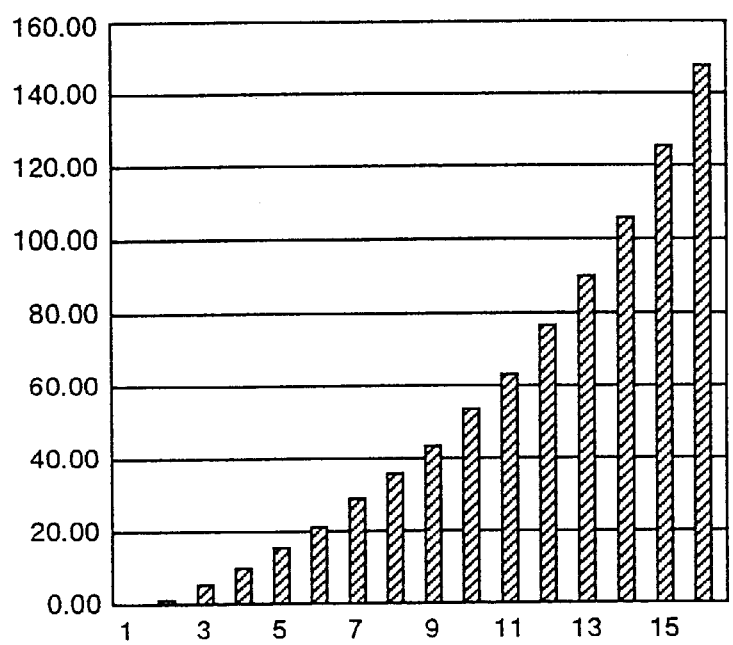
FIG. 2A and FIG. 2B are diagrams which show an example of DAC current values output for values of registers 0 to 3 in the digital-to-analog conversion circuit of the first embodiment.

FIG. 2A and FIG. 2B are diagrams which show an example of DAC current values that are output based on the values of the resisters 0 to 3 in the digital-to-analog conversion circuit of the first embodiment (current value of the constant current source 9 is 100 µA). For example, when the register 3, the register 2, the register 1 and the register 0 have the logic levels "H", "H", "L" and "H" respectively, that is, when the four-bit data is "1101", the p-channel MOS transistors M41, M31 and M11 are is turned ON.

Further, as the p-channel MOS transistor M61 becomes an ON status at the same time, the gate currents of the p-channel MOS transistors M41, M31 and M11 that have become in the ON statuses decrease so that the sum of these gate currents and the drain currents according to the W-size of the p-channel MOS transistor M61, that is, a×2, coincides with the lead-in current by the constant current source 9. In other words, the DAC current finally obtained is expressed as 108.33 µA that is obtained by multiplying a drain current (100/(10+2) µA) determined as a unit by the W-size a with 13 that is a total number of the W-sizes of the p-channel MOS transistors M41, M31 and M11 that are in the ON statuses.

As a decimal value expressed by the four bits of the registers 0 to 3 increases from 0 to 15 as shown in an example in FIG. 2A, the DAC current increases non-linearly as expressed by a graph convex in downward in FIG. 2B. Accordingly, in the PLL circuit, the DAC current that increases non-linearly when the digital value output from the phase comparator increases by one each time is input into the ICO.

Figure 3:
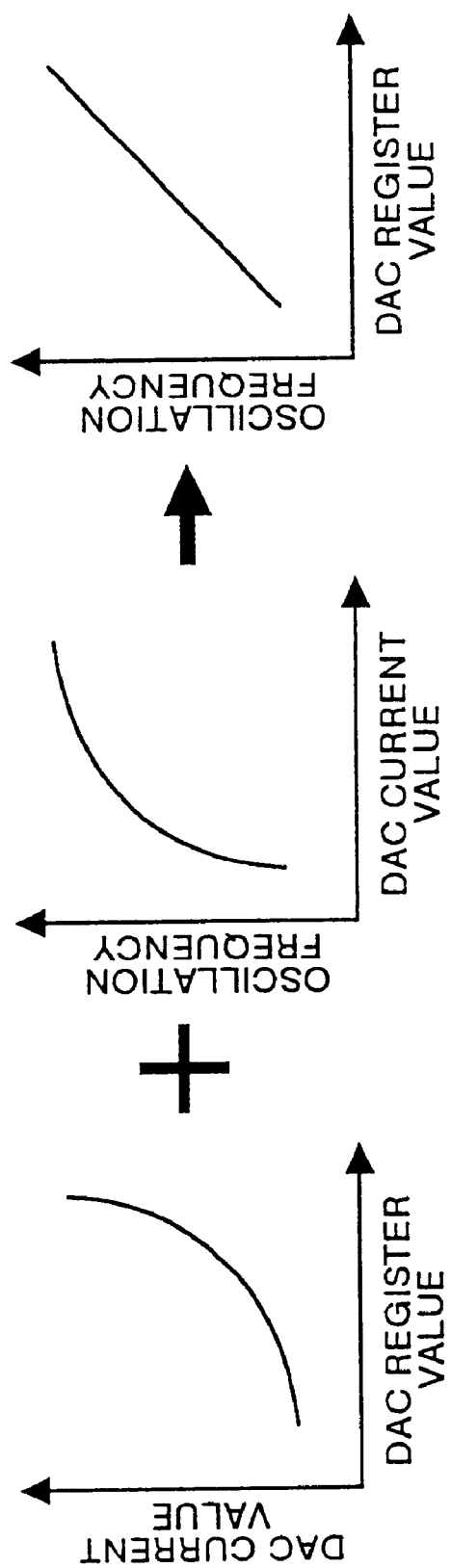
FIG. 3 is a diagram which shows a relationship between DAC register values and an oscillation frequency in a PLL circuit of the digital-to-analog conversion circuit of the first embodiment.

FIG. 3 is a diagram which shows a relationship between the DAC register values and the oscillation frequency in the PLL circuit in the digital-to-analog conversion circuit relating to the first embodiment. As shown in FIG. 3, when the relationship between the DAC register values and the DAC current values in the digital-to-analog conversion circuit which has a non-linear characteristic having a convex shape facing downward is added to the relationship between the DAC current values and the oscillation frequency in the ICO which has a non-linear characteristic having a convex shape facing upward, it is possible to obtain a linear relationship between the DAC register values and the oscillation frequency.

As explained above, according to the digital-to-analog conversion circuit of the first embodiment, there are provided the p-channel MOS transistors M51, M52, M53, M61, M62, M63, M71, M72, M73, M81, M82 and M83 and the four inverters G50, G60, G70 and G80 for adjusting the gate currents of the p-channel MOS transistor M11, M21, M31 and M41 that supply DAC currents. These p-channel MOS transistors are controlled to have the non-linear input and output characteristic that increase of DAC current by rising of value which the registers 0 to 3 indicate. Accordingly, when this DAC current is input into the ICO in the PLL circuit, it is possible to linearly change the oscillation frequency linearly to the output of the phase comparator. Therefore, a high-speed synchronized operation can be achieved.

A digital-to-analog conversion circuit of a second embodiment will be explained below. The digital-to-analog conversion circuit of the second embodiment is different from the digital-to-analog conversion circuit of the first embodiment in that a switch structure of MOS transistors for supplying a DAC current according to a value in the registers 0 to 3 is formed by a cascode connection.

Figure 4:
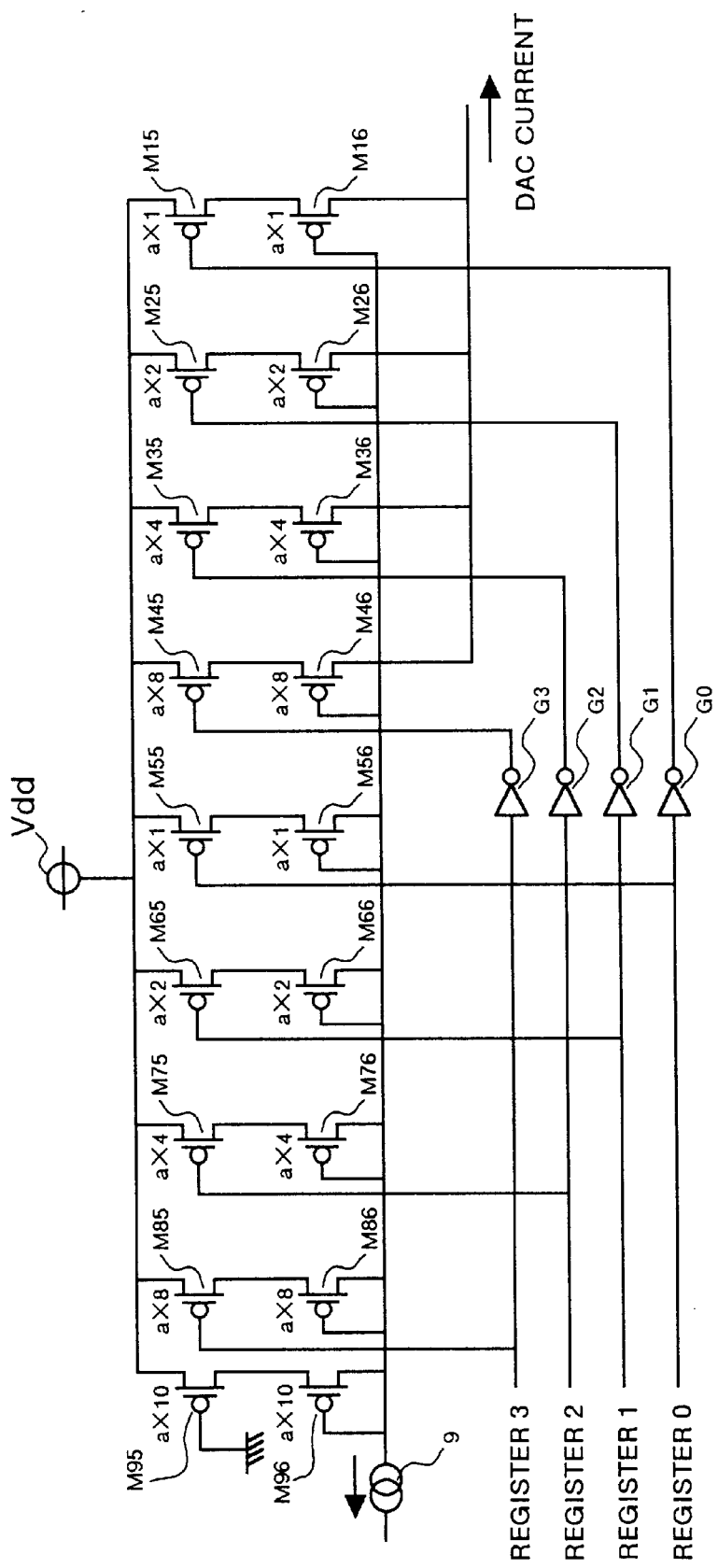
FIG. 4 is a diagram which shows a circuit structure of a digital-to-analog conversion circuit of a second embodiment.

FIG. 4 is a diagram which shows a circuit structure of the digital-to-analog conversion circuit of the second embodiment. In FIG. 4, portions common to those in FIG. 1 are attached with the same reference numbers and their explanation will be omitted. The digital-to-analog conversion circuit shown in FIG. 4 includes the inverters G0 to G3 for inverting the inputs of the registers 0 to 3 respectively. The circuit further includes eight p-channel MOS transistors M15, M16, M25, M26, M35, M36, M45 and M46 for taking out a current from the power source voltage Vdd according to a signal output from the inverters G0 to G3 and for outputting the taken-out current as a DAC current, and ten p-channel MOS transistors M55, M56, M65, M66, M75, M76, M85, M86, M95 and M96 for controlling the gate currents of p-channel MOS transistors M16, M26, M36 and M46.

A detailed structure and operation of this digital-to-analog conversion circuit will be explained below. In FIG. 4, there correspond to the register 0, a series-connected structure including the inverter G0, the p-channel MOS transistor M15 having its source connected to the power source voltage Vdd and the p-channel MOS transistor M16 having its drain connected to the output terminal of the DAC current and a series-connected structure including the p-channel MOS transistor M55 having its source connected to the power source voltage Vdd and the p-channel MOS transistor M56 having its drain connected to the constant current source 9.

Then, the output of the inverter G0 is input into the gate of the p-channel MOS transistor M15, and the constant current source 9 is connected to the gate of the p-channel MOS transistor M16. Further, a signal in the register 0 is input into the gate of the p-channel MOS transistor M55, and the constant current source 9 is connected to the gate of the p-channel MOS transistor M56. In this case, the W-sizes of the p-channel MOS transistors M15, M16, M55 and M56 are set to a respectively.

With the above-described structure, when the register 0 has the logic lesvel "L", the p-channel MOS transistor M15 is turned OFF and the p-channel MOS transistor M55 is turned ON, based on the output of the inverter G0. In this case, both the p-channel MOS transistors M16 and M56 are always in ON statuses respectively. As no current is supplied from the power source voltage Vdd, a drain current of the p-channel MOS transistor M16 is not obtained, and there is no change in the DAC current.

On the other hand, when the register 0 has the logic level "H", the p-channel MOS transistor M15 is turned ON and the p-channel MOS transistor M55 is turned OFF, based on the output of the inverter G0. Accordingly, a drain current of the p-channel MOS transistor M16 is added to the DAC current, based on the current from the power source voltage Vdd.

Similarly, there correspond to the register 1, a series-connected structure including the inverter G1, the p-channel MOS transistor M25 having its source connected to the power source voltage Vdd and the p-channel MOS transistor M26 having its drain connected to the output terminal of the DAC current and a series-connected structure including the p-channel MOS transistor M65 having its source connected to the power source voltage Vdd and the p-channel MOS transistor M66 having its drain connected to the constant current source 9.

Then, the output of the inverter G1 is input into the gate of the p-channel MOS transistor M25, and the constant current source 9 is connected to the gate of the p-channel MOS transistor M26. Further, a signal of the register 1 is input into the gate of the p-channel MOS transistor M65, and the constant current source 9 is connected to the gate of the p-channel MOS transistor M66. In this case, the W-sizes of the p-channel MOS transistors M25, M26, M65 and M66 are set to two times the W-size of the p-channel MOS transistor M15, that is, a×2, respectively.

With the above-described structure, when the register 1 has the logic level "L", the p-channel MOS transistor M25 is turned OFF and the p-channel MOS transistor M65 is turned ON, based on the output of the inverter G1. In this case, both the p-channel MOS transistors M26 and M66 are always ON. As the electric current is supplied by the power source voltage Vdd, a drain current of the p-channel MOS transistor M26 is not obtained, and there is no change in the DAC current.

On the other hand, when the register 1 has the logic level "H", the p-channel MOS transistor M25 becomes an ON status and the p-channel MOS transistor M65 becomes an OFF status, based on the output of the inverter G1. Accordingly, a drain current of the p-channel MOS transistor M26 is added to the DAC current, based on the current from the power source voltage Vdd.

The register 2 and the register 3 also have structures and operations similar to those described above, and their explanation will be omitted. However, in FIG. 4, of the structure corresponding to the register 2, the W-sizes of the p-channel MOS transistors M35, M36, M75 and M76 have four times the W-size of the p-channel MOS transistor M15, that is a×4. Further, of the structure corresponding to the register 3, the W-sizes of the p-channel MOS transistors M45, M46, M85 and M86 have eight times the W-size of the p-channel MOS transistor M15, that is a×8.

As explained above, there is provided for each of the registers 0 to 3 a structure for adding a current to the DAC current according to the signal level of each register. Further, the W-sizes is changed among the MOS transistors M16, M26, M36 and M46 that supply a current respectively. With this arrangement, it is possible to output the DAC current as a sum of signals of these registers, that is, as a sum of currents of these registers with different weight on each bit.

Further, the DAC currents that appear based on the respective ON statuses of the p-channel MOS transistors M15, M25, M35 and M45 are determined by the gate currents of the p-channel MOS transistors M16, M26, M36 and M46. Accordingly, in the circuit structure shown in FIG. 4, the values of the drain currents of these p-channel MOS transistors M16, M26, M36 and M46 are determined based on the ON/OFF statuses of the p-channel MOS transistors M55, M65, M75 and M85 respectively. As the ON/OFF statuses of the p-channel MOS transistors M55, M65, M75 and M85 are controlled according to the signals in the registers 0 to 3 as described above, the DAC currents change according to the signals in the registers 0 to 3 in the end.

However, according to the digital-to-analog conversion circuit relating to the second embodiment, the ON/OFF control of the p-channel MOS transistors M15, M25, M35 and M45 and the ON/OFF control of the p-channel MOS transistors M55, M65, M75 and M85 are mutually inverted with respect to the logic status of the four bits of the registers 0 to 3, in a similar manner to that of the first embodiment. Accordingly, the DAC current value finally obtained becomes smaller than that obtained by the conventional digital-to-analog conversion circuit, by the current component corresponding to the drain current of the p-channel MOS transistor M56, M66, M76 or M86 that is in cascode connection with the p-channel MOS transistor M55, M65, M75 or M85 that becomes the ON status for the signals of the registers 0 to 3 excluding the maximum value (15) and the minimum value (0).

Particularly, the p-channel MOS transistor M55, M65, M75 or M85 that becomes an ON status is selected so that, as the value expressed by the registers 0 to 3 increases, the rate of increase in the sum of the drain currents can be lower. Therefore, the distribution of DAC currents for the values in the registers 0 to 3 (DAC register values) is expressed to have a non-linear relationship convex in downward, in a similar manner to that of the first embodiment.

Therefore, as shown in FIG. 3, the digital-to-analog conversion circuit relating to the second embodiment also has the following relationship. When the relationship between the DAC register values and the DAC current values in the digital-to-analog conversion circuit which has a non-linear characteristic having a convex shape facing downward is added to the relationship between the DAC current values and the oscillation frequency in the ICO which has a non-linear characteristic having a convex shape facing upward, it is possible to obtain a linear relationship between the DAC register values and the oscillation frequency.

As explained above, according to the digital-to-analog conversion circuit relating to the second embodiment, there are provided the p-channel MOS transistors M55, M56, M65, M66, M75, M76, M85, M86, M95 and M96 for adjusting the gate currents of the p-channel MOS transistor M16, M26, M36 and M46 that supply DAC currents. These p-channel MOS transistors are controlled to have the non-linear input and output characteristic that increase of DAC current by rising of value which the registers 0 to 3 indicate. Accordingly, when this DAC current is input into the ICO in the PLL circuit, it is possible to change the oscillation frequency linearly to the output of the phase comparator. Therefore, a high-speed synchronized operation can be achieved.

As explained above, according to one aspect of the present invention, currents that are output according to input digital values (corresponding to DAC currents described above) are added together by the switching operation of first MOS transistors allocated to respective bits. The distribution of current values corresponding to the digital values is controlled by second MOS transistors to have a non-linear relationship. Therefore, the present invention has an effect which is that an oscillation frequency that linearly changes with respect to the digital values can be obtained by inputting the DAC currents of the digital-to-analog conversion circuit to an ICO of a PLL circuit, for example. Thus, high-speed synchronization becomes possible.

Further, the above-described non-linear input and output characteristic can be obtained, by changing the sizes of the first MOS transistors in the ON statuses and the sizes of the second MOS transistors in the ON statuses, depending on the statuses of each bits of the digital values input. Therefore, the invention has an effect which is that a non-linear characteristic can be easily obtained by only adding the second MOS transistors with changed sizes, without complicating the circuit structure.

Further, the second MOS transistors can control the first MOS transistors so that the non-linear relationship of the current values output to the input digital values can be expressed by a graph convex in downward. Therefore, when the DAC currents are input into other circuit that produces a non-linear physical output for a current input that is expressed by a graph convex in upward, for example, the ICO of the PLL circuit, it is possible to obtain an output of physical quantity that changes linearly based on inputs of digital values in this circuit.

Further, for each bit constituting the digital values, there is allocated a structure consisting of the first MOS transistor and a third MOS transistor which are set to ON statuses when the corresponding bits are in ON statuses, and there is allocated a structure consisting of the second MOS transistor and a fourth MOS transistor which are set to OFF statuses when the corresponding bits are in ON statuses. Furthermore, the second to fourth MOS transistors are connected to a constant current source. Therefore, it is possible to output the DAC currents obtained from the first MOS transistors with weighting each of the above-described structures based on the currents of the constant current source.

Further, for each bit constituting the digital values, there is allocated a structure consisting of the first MOS transistor and a third MOS transistor connected in series with the first MOS transistor and having its gate connected to the constant current source which are set to ON statuses when the corresponding bits are in ON statuses, and there is also allocated a structure consisting of the second MOS transistor and a fourth MOS transistor having its gate connected to the constant current source which are set to OFF statuses when the corresponding bits are in ON statuses. Therefore, it is possible to output the DAC currents obtained from the first MOS transistors by weighting each of the above-described structures based on the currents of the constant current source.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A digital-to-analog conversion circuit comprising:
   a plurality of first MOS transistors, each first MOS transistor having a different size corresponding to a respective bit in received digital data, each first MOS transistor applying a weight to an input current by switching and outputting a weighted current; and
   a plurality of second MOS transistors, each second MOS transistor having a different size corresponding to the respective bits in the received digital data, applying a weight to a current to be input into said first MOS transistors that are ON by switching, wherein said second MOS transistors apply a weight to the current to be input to said first MOS transistors so a sum of currents output from said first MOS transistors has a non-linear characteristic relative to the received digital data.

2. The digital-to-analog conversion circuit according to claim 1, wherein
   said first MOS transistors have different sizes that correspond to the bits in the digital data, higher bits corresponding to larger sizes and are turned ON when the corresponding bit is ON, and
   said second MOS transistors have different sizes that correspond to the bits in the digital data, higher bits corresponding to larger sizes and are turned OFF when the corresponding bit is ON.

3. The digital-to-analog conversion circuit according to claim 1, wherein said second MOS transistors control drain currents of said first MOS transistors that are turned ON so that the currents output according to the digital data have a non-linear characteristic that when plotted on a graph has a convex shape facing downward.

4. The digital-to-analog conversion circuit according to claim 1, further comprising
   a constant current source;
   a plurality of third MOS transistors having respective drains connected to said constant current source and respective sources connected to corresponding gates of said first MOS transistors, and which are turned ON when corresponding bits are ON; and
   a plurality of fourth MOS transistors having respective drains connected to said constant current source, and which are turned OFF when corresponding bits are ON, wherein said second MOS transistors have respective drains connected to said constant current source and have respective gates connected to corresponding sources of respective fourth MOS transistors.

5. The digital-to-analog conversion circuit according to claim 1, further comprising
   a constant current source;
   a plurality of third MOS transistors having respective gates connected to said constant current source; and
   a plurality of fourth MOS transistors having respective gates and drains connected to said constant current source, wherein respective first MOS transistors are connected in series with corresponding third MOS transistors, and respective second MOS transistors are connected in series with corresponding fourth MOS transistors.

6. A graphic display unit comprising at least one of the digital-analog converting circuits according to claims 4 or 5.

7. A television receiver comprising at least one of the digital-analog converting circuits according to claim 4 or 5.

8. A digital-analog converting circuit according to claim 3 and also relating to claim 2;
   wherein the logic gate is an AND gate and a change of slope $\Delta P_n$ is positive.

* * * * *